(12) United States Patent
Phillips et al.

(10) Patent No.: US 10,697,059 B2
(45) Date of Patent: Jun. 30, 2020

(54) THICKNESS COMPENSATION BY MODULATION OF NUMBER OF DEPOSITION CYCLES AS A FUNCTION OF CHAMBER ACCUMULATION FOR WAFER TO WAFER FILM THICKNESS MATCHING

(71) Applicant: Lam Research Corporation, Fremont, CA (US)

(72) Inventors: Richard Phillips, Tualatin, OR (US); Chloe Baldasseroni, Tigard, OR (US); Nishanth Manjunath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/785,093

(22) Filed: Oct. 16, 2017

(65) Prior Publication Data

US 2019/0085448 A1    Mar. 21, 2019

Related U.S. Application Data

(60) Provisional application No. 62/559,434, filed on Sep. 15, 2017.

(51) Int. Cl.
*C23C 16/455* (2006.01)
*C23C 16/40* (2006.01)
(Continued)

(52) U.S. Cl.
CPC ...... *C23C 16/45527* (2013.01); *C23C 16/345* (2013.01); *C23C 16/401* (2013.01);
(Continued)

(58) Field of Classification Search
CPC ............... C23C 16/52; C23C 16/45527
See application file for complete search history.

(56) References Cited

U.S. PATENT DOCUMENTS 6,051,284 A    4/2000  Byrne et al.
6,860,965 B1   3/2005  Stevens
(Continued)

FOREIGN PATENT DOCUMENTS

CN    1853003 A    10/2006
CN    101061253 A   10/2007
(Continued)

OTHER PUBLICATIONS

U.S. Office Action, dated Aug. 26, 2016, issued in U.S. Appl. No. 14/455,796.
(Continued)

*Primary Examiner* — Joseph A Miller, Jr.
(74) *Attorney, Agent, or Firm* — Weaver Austin Villeneuve & Sampson LLP

(57) ABSTRACT

Methods and apparatuses for performing atomic layer deposition are provided. A method may include determining an amount of accumulated deposition material currently on an interior region of a deposition chamber interior, wherein the amount of accumulated deposition material changes over the course of processing a batch of substrates; applying the determined amount of accumulated deposition material to a relationship between a number of ALD cycles required to achieve a target deposition thickness, and a variable representing an amount of accumulated deposition material, wherein the applying returns a compensated number of ALD cycles for producing the target deposition thickness given the amount of accumulated deposition material currently on the interior region of the deposition chamber interior; and performing the compensated number of ALD cycles on one or more substrates in the batch.

15 Claims, 6 Drawing Sheets

(51) Int. Cl.
*C23C 16/34* (2006.01)
*C23C 16/52* (2006.01)
*G06F 17/11* (2006.01)
*H01L 21/02* (2006.01)
*H01L 21/66* (2006.01)
*H01L 21/677* (2006.01)

(52) U.S. Cl.
CPC ............... *C23C 16/52* (2013.01); *G06F 17/11* (2013.01); *H01L 21/0217* (2013.01); *H01L 21/0228* (2013.01); *H01L 21/02164* (2013.01); *H01L 21/02274* (2013.01); *H01L 21/67754* (2013.01); *H01L 22/26* (2013.01)

(56) References Cited

U.S. PATENT DOCUMENTS

| | | |
|---|---|---|
| 7,479,191 B1 | 1/2009 | Entley et al. |
| 8,119,527 B1 | 2/2012 | Chadrashekar et al. |
| 8,262,800 B1 | 9/2012 | Wongsenakhum et al. |
| 8,591,659 B1 | 11/2013 | Fang et al. |
| 8,637,411 B2 | 1/2014 | Swaminathan et al. |
| 8,728,956 B2 | 5/2014 | LaVoie et al. |
| 8,956,983 B2 | 2/2015 | Swaminathan et al. |
| 9,076,646 B2 | 7/2015 | Sims et al. |
| 9,263,350 B2 | 2/2016 | Kapoor et al. |
| 9,355,886 B2 | 5/2016 | Swaminathan et al. |
| 9,502,238 B2 | 11/2016 | Danek et al. |
| 9,624,578 B2 | 4/2017 | Qian et al. |
| 9,677,176 B2 | 6/2017 | Chandrasekharan et al. |
| 9,745,658 B2 | 8/2017 | Kang et al. |
| 9,797,042 B2 | 10/2017 | Nowak et al. |
| 10,577,691 B2 | 3/2020 | Nowak et al. |
| 2002/0076481 A1 | 6/2002 | Chiang et al. |
| 2004/0001787 A1 | 1/2004 | Porshnev et al. |
| 2005/0019963 A1* | 1/2005 | Zhao .................. C23C 16/4405 438/14 |
| 2005/0031786 A1 | 2/2005 | Lee et al. |
| 2006/0156979 A1 | 7/2006 | Thakur et al. |
| 2006/0166501 A1 | 7/2006 | Kaushal et al. |
| 2006/0169669 A1 | 8/2006 | Zojaji et al. |
| 2006/0280868 A1* | 12/2006 | Kato .................. C23C 16/4404 427/248.1 |
| 2007/0235059 A1* | 10/2007 | Chu .................... B08B 7/0035 134/1.1 |
| 2008/0131601 A1 | 6/2008 | Kim et al. |
| 2008/0283088 A1 | 11/2008 | Shima et al. |
| 2009/0208650 A1 | 8/2009 | Narushima et al. |
| 2009/0325366 A1 | 12/2009 | Moriya et al. |
| 2010/0089870 A1 | 4/2010 | Hiroshima et al. |
| 2011/0256726 A1 | 10/2011 | La Voie et al. |
| 2012/0009802 A1 | 1/2012 | LaVoie et al. |
| 2012/0048821 A1 | 3/2012 | Kapla |
| 2012/0288615 A1 | 11/2012 | Jung |
| 2012/0325145 A1 | 12/2012 | Satoyoshi et al. |
| 2012/0328771 A1 | 12/2012 | Papasoulitotis et al. |
| 2013/0196078 A1 | 8/2013 | Yudovsky et al. |
| 2013/0260057 A1 | 10/2013 | Wu et al. |
| 2014/0030444 A1 | 1/2014 | Swaminathan et al. |
| 2014/0053867 A1 | 2/2014 | Fang et al. |
| 2014/0069459 A1 | 3/2014 | Guan et al. |
| 2014/0087093 A1 | 3/2014 | Kilpi et al. |
| 2014/0113457 A1 | 4/2014 | Sims et al. |
| 2014/0120737 A1 | 5/2014 | Swaminathan et al. |
| 2014/0134827 A1 | 5/2014 | Swaminathan et al. |
| 2014/0209562 A1 | 7/2014 | La Voie et al. |
| 2015/0007770 A1 | 1/2015 | Chandrasekharan et al. |
| 2015/0017812 A1 | 1/2015 | Chandrasekharan et al. |
| 2015/0332912 A1 | 11/2015 | Nowak et al. |
| 2016/0090650 A1 | 3/2016 | Qian et al. |
| 2016/0340782 A1 | 11/2016 | Chandrasekharan et al. |
| 2016/0348242 A1 | 12/2016 | Sung et al. |
| 2017/0029947 A1 | 2/2017 | Kawahara et al. |
| 2017/0029948 A1 | 2/2017 | Jongbloed et al. |
| 2017/0314129 A1 | 11/2017 | Karim et al. |
| 2018/0010250 A1 | 1/2018 | Nowak et al. |

FOREIGN PATENT DOCUMENTS

| | | |
|---|---|---|
| CN | 101330015 A | 12/2008 |
| CN | 102758191 A | 10/2012 |
| CN | 102839360 A | 12/2012 |
| CN | 103443325 A | 12/2013 |
| CN | 105088197 A | 11/2015 |
| JP | H05-121332 A | 5/1993 |
| JP | 2001-007089 A | 1/2001 |
| JP | 2001-073132 A | 3/2001 |
| JP | 2004-068091 A | 3/2004 |
| JP | 2008-056949 A | 3/2008 |
| JP | 2008-513980 A | 5/2008 |
| JP | 2008-288340 A | 11/2008 |
| JP | 2009-543355 A | 12/2009 |
| KR | 10-2007-0000279 A | 1/2007 |
| KR | 10-0715862 B1 | 5/2007 |
| KR | 10-2013-0127588 A | 11/2013 |
| TW | 2014-04927 A | 2/2014 |
| WO | WO 2008/047838 | 4/2008 |
| WO | WO2011/125471 A1 | 10/2011 |
| WO | WO2014/142031 A1 | 9/2014 |

OTHER PUBLICATIONS

U.S. Final Office Action, dated Mar. 7, 2017, issued in U.S. Appl. No. 14/455,796.
U.S. Notice of Allowance, dated Jun. 15, 2017, issued in U.S. Appl. No. 14/455,796.
Chinese First Office Action dated May 24, 2017, issued in Application No. CN 201510245528.X.
Chinese Second Office Action dated Feb. 23, 2018, issued in Application No. CN 201510245528.X.
U.S. Office Action dated Feb. 1, 2016 issued in U.S. Appl. No. 14/502,947.
U.S. Final Office Action dated May 13, 2016 issued in U.S. Appl. No. 14/502,947.
U.S. Office Action dated Aug. 22, 2016 issued in U.S. Appl. No. 14/502,947.
U.S. Notice of Allowance dated Dec. 13, 2016 in U.S. Appl. No. 14/502,947.
Chinese First Office Action dated Jul. 3, 2017 issued in Application No. CN 201510642077.3.
U.S. Office Action, dated Feb. 7, 2019, issued in U.S. Appl. No. 15/143,338.
Chinese Third Office Action dated Sep. 25, 2018, issued in Application No. CN 201510245528.X.
Japanese Office Action [Reason for Refusal] dated Mar. 27, 2019, issued in Application No. JP 2015-095293.
Taiwanese First Office Action dated Oct. 1, 2018, issued in Application No. TW 104115353.
Chinese First Office Action dated Feb. 12, 2019, issued in Application No. CN 201710291562.X.
International Search Report and Written Opinion dated Feb. 1, 2019, issued in Application No. PCT/US18/49864.
Chinese Second Office Action dated Nov. 1, 2018 issued in Application No. CN 201510642077.3.
Taiwan First Office Action dated Mar. 7, 2019 issued in Application No. TW 104131525.
Profijt, H.B., et al., "Plasma-Assisted Atomic Layer Deposition: Basics, Opportunities, and Challenges," J. Vac. Sci. Technol. A, vol. 29, No. 5 (Sep./Oct. 2011), pp. 1-26.
Kaariainen, T., et al., "Plasma-Assisted Atomic Layer Deposition of Al2O3 at Room Temperature," Plasma Processes and Polymers (2009) vol. 6, pp. S237-S241.
U.S. Office Action, dated Jun. 13, 2019, issued in U.S. Appl. No. 15/703,694.
U.S. Notice of Allowance, dated Oct. 10, 2019, issued in U.S. Appl. No. 15/703,694.

(56) References Cited

OTHER PUBLICATIONS

U.S. Final Office Action, dated Aug. 15, 2019, issued in U.S. Appl. No. 15/143,338.
Japanese Decision to Grant dated Jul. 16, 2019, issued in Application No. JP 2015-095293.
Chinese Second Office Action dated Sep. 9, 2019, issued in Application No. CN 201710291562.X.
Chinese Third Office Action dated May 7, 2019 issued in Application No. CN 201510642077.3.
Japanese First Office Action dated Jul. 23, 2019 issued in Application No. JP 2015-187136.
Taiwan Second Office Action dated Nov. 27, 2019 issued in Application No. TW 104131525.
Singapore Notice of Eligibility for Grant & Supplementary Examination Report dated Jan. 17, 2020 in SG Application No. 10201503283S.
Singapore Notice of Eligibility for Grant & Supplementary Examination Report dated Jan. 20, 2020 in SG Application No. 102015007987R.
Singapore Written Opinion and Search Report dated Jan. 20, 2020 in SG Application No. 10201703133P.
Japanese Second Office Action dated Apr. 21, 2020 issued in Application No. JP 2015-187136.
Chinese Third Office Action dated Apr. 1, 2020, issued in Application No. CN 201710291562.X.
International Preliminary Report on Patentability dated Mar. 26, 2020 issued in Application No. PCT/US2018/049864.

\* cited by examiner

| Wafer Set | Wafer Count | Measured Thickness (Å) | Accumulation (Å) | Cycle Count | Normalized Cycle Count | Compensated Cycle Count |
|---|---|---|---|---|---|---|
| 1 | 4 | 1024.0 | 2210.9 | 1234 | 1.000 | 1234 |
| 2 | 8 | 1023.0 | 3234.9 | 1234 | 1.001 | 1235 |
| 3 | 12 | 1021.9 | 4258.9 | 1234 | 1.002 | 1236 |
| 4 | 16 | 1020.9 | 5282.9 | 1234 | 1.003 | 1238 |
| 5 | 20 | 1019.8 | 6306.9 | 1234 | 1.004 | 1239 |
| 6 | 24 | 1018.8 | 7330.9 | 1234 | 1.005 | 1240 |
| 7 | 28 | 1017.7 | 8354.9 | 1234 | 1.006 | 1241 |
| 8 | 32 | 1016.7 | 9378.9 | 1234 | 1.007 | 1243 |
| 9 | 36 | 1015.7 | 10402.9 | 1234 | 1.008 | 1244 |
| 10 | 40 | 1014.6 | 11426.9 | 1234 | 1.009 | 1245 |
| 11 | 44 | 1013.6 | 12450.9 | 1234 | 1.010 | 1246 |
| 12 | 48 | 1012.5 | 13474.9 | 1234 | 1.011 | 1248 |
| 13 | 52 | 1011.5 | 14498.9 | 1234 | 1.012 | 1249 |
| 14 | 56 | 1010.4 | 15522.9 | 1234 | 1.013 | 1250 |
| 15 | 60 | 1009.4 | 16546.9 | 1234 | 1.014 | 1251 |
| 16 | 64 | 1008.3 | 17570.9 | 1234 | 1.016 | 1254 |
| 17 | 68 | 1007.3 | 18594.9 | 1234 | 1.017 | 1255 |
| 18 | 72 | 1006.3 | 19618.9 | 1234 | 1.018 | 1256 |
| 19 | 76 | 1005.2 | 20642.9 | 1234 | 1.019 | 1257 |
| 20 | 80 | 1004.2 | 21666.9 | 1234 | 1.020 | 1259 |
| 21 | 84 | 1003.1 | 22690.9 | 1234 | 1.021 | 1260 |
| 22 | 88 | 1002.1 | 23714.9 | 1234 | 1.022 | 1261 |
| 23 | 92 | 1001.0 | 24738.9 | 1234 | 1.023 | 1262 |
| 24 | 96 | 1000.0 | 25762.9 | 1234 | 1.024 | 1264 |

Time →

Figure 5

THICKNESS COMPENSATION BY MODULATION OF NUMBER OF DEPOSITION CYCLES AS A FUNCTION OF CHAMBER ACCUMULATION FOR WAFER TO WAFER FILM THICKNESS MATCHING

CROSS-REFERENCE TO RELATED APPLICATIONS

This application claims benefit of priority under 35 U.S.C. § 119(e) from U.S. Provisional Patent Application No. 62/559,434, filed on Sep. 15, 2017, which is hereby incorporated herein by reference in its entirety for all purposes.

BACKGROUND

The fabrication of integrated circuits includes many diverse processing steps. One of the operations frequently employed is the deposition of a dielectric film. The film may be deposited on a relatively flat substrate, or it may be deposited into a gap between features patterned over or into silicon substrates. One method of depositing such a film is through plasma assisted atomic layer deposition (ALD). In this type of method, several operations are undertaken in a cyclic manner to deposit a conformal film. Typically, ALD processes include the steps of (a) providing a dose of a first reactant to a reaction chamber, (b) purging the reaction chamber, (c) flowing a second reactant to the reaction chamber, (d) igniting a plasma in the reaction chamber, and (e) extinguishing the plasma and purging the reaction chamber. As a result of the nature of precursor delivery/adsorption onto the substrate surface, a single cycle of an ALD process typically deposits about a monolayer of material. The operations may be repeated a number of times to deposit additional monolayers to reach a desired film thickness. Defining modes of operation that optimizes both throughput and uniformity remains a challenge.

SUMMARY

In one embodiment, a method of performing atomic layer deposition in a deposition chamber is provided. The method may include (a) determining an amount of accumulated deposition material currently on at least an interior region of a deposition chamber interior, the amount of accumulated deposition material changing over the course of processing a batch of substrates, (b) applying the amount of accumulated deposition material determined in (a), or a parameter derived therefrom, to a relationship between (i) a number of ALD cycles required to achieve a target deposition thickness, and (ii) a variable representing an amount of accumulated deposition material, the applying returns a compensated number of ALD cycles for producing the target deposition thickness given the amount of accumulated deposition material currently on the interior region of the deposition chamber interior, and (c) performing the compensated number of ALD cycles on one or more substrates in the batch of substrates.

In some embodiments, determining the amount of accumulated deposition material may include calculating the amount of accumulated deposition material by using a number of ALD cycles performed and a predicted amount of accumulated deposition material per ALD cycle.

In some embodiments, the amount of accumulated deposition material may vary substantially linearly over the course of processing a batch of substrates.

In some embodiments, the amount of accumulated deposition material may vary substantially linearly with a number of ALD cycles.

In some embodiments, determining the amount of accumulated deposition material may include measuring the amount of accumulated deposition material in situ.

In some embodiments, the relationship may be based, at least in part, on a trend of thicknesses of substrates in a batch of substrates over the course of processing that batch of substrates.

In some embodiments, the relationship may be based, at least in part, on data of at least one processed batch of substrates, the same number of deposition cycles may have been performed on each of the substrates in the processed batch of substrates, and the data may include thicknesses of a plurality of substrates in the processed batch of substrates and the corresponding amount of accumulated deposition material for each of the substrates in the plurality of substrates.

In some such embodiments, the relationship may be a polynomial fit of the data.

In some embodiments, the relationship may be a polynomial relationship in which compensated number of ALD cycles for producing the target deposition thickness is a function of the variable representing the amount of accumulated deposition material and the variable representing the amount of accumulated deposition material may be raised to a power.

In some such embodiments, the power may be three.

In some such other embodiments, the polynomial relationship may express the number of ALD cycles required to achieve a target deposition thickness as a function of a sum of terms. At least two of the terms may include the variable representing the amount of accumulated deposition currently on the interior region of the deposition chamber interior raised to a power.

In some such other embodiments, the polynomial relationship may be expressed as the following: the compensated number of ALD cycles=the number of ALD cycles required to achieve a target deposition thickness times $(x^3*A+x^2*B+x*C+1*D)$. X may be the amount of accumulated deposition currently on the interior region of the deposition chamber interior and A, B, C, and D may be constants.

In some embodiments, the method may further include (d) repeating (a) through (c) for all of the substrates in the batch of substrates.

In some embodiments, the method may further include (e) removing, after (c), the one or more substrates from the deposition chamber. The one or more substrates may include an ALD deposited layer having the target deposition thickness.

In some embodiments, the atomic layer deposition may produce a silicon oxide film or silicon nitride film.

In one embodiment, a system may be provided. The system may include a deposition chamber for performing ALD disposition, and a controller for controlling the deposition chamber to deposit a material on a substrate in the deposition chamber. The controller may include comprising control logic for: (a) determining an amount of accumulated deposition material currently on at least an interior region of a deposition chamber interior, the amount of accumulated deposition material changing over the course of processing a batch of substrates, (b) applying the amount of accumulated deposition material determined in (a), or a parameter derived therefrom, to a relationship between (i) a number of ALD cycles required to achieve a target deposition thickness, and (ii) a variable representing the amount of accumulated deposition material, the applying returns a compensated number of ALD cycles for producing the target deposition thickness given the amount of accumulated deposition material currently on the interior region of the deposition chamber interior, and (c) performing the compensated number of ALD cycles on one or more substrates in the batch of substrates.

In some embodiments, the deposition chamber may include two or more processing stations.

In some embodiments, the controller may further include control logic for: (d) stopping the processing of the batch of substrates in response to a determination that the amount of accumulated deposition material currently on at least an interior region of the deposition chamber interior has reached an accumulation limit, and (e) after (d), cleaning the deposition chamber interior.

In some embodiments, the relationship may be based, at least in part, on data of at least one processed batch of substrates, the same number of deposition cycles may have been performed on each of the substrates in the processed batch of substrates, and the data may include thicknesses of a plurality of substrates in the processed batch of substrates and the corresponding amount of accumulated deposition material for each of the substrates in the plurality of substrates.

In some embodiments, determining the amount of accumulated deposition material may include calculating the amount of accumulated deposition material by using a number of ALD cycles performed and a predicted amount of accumulated deposition material per ALD cycle.

BRIEF DESCRIPTION OF THE DRAWINGS

FIG. 5 depicts a table depicting various values for an example deposition process of a batch of substrates.

DETAILED DESCRIPTION

Figure 1:
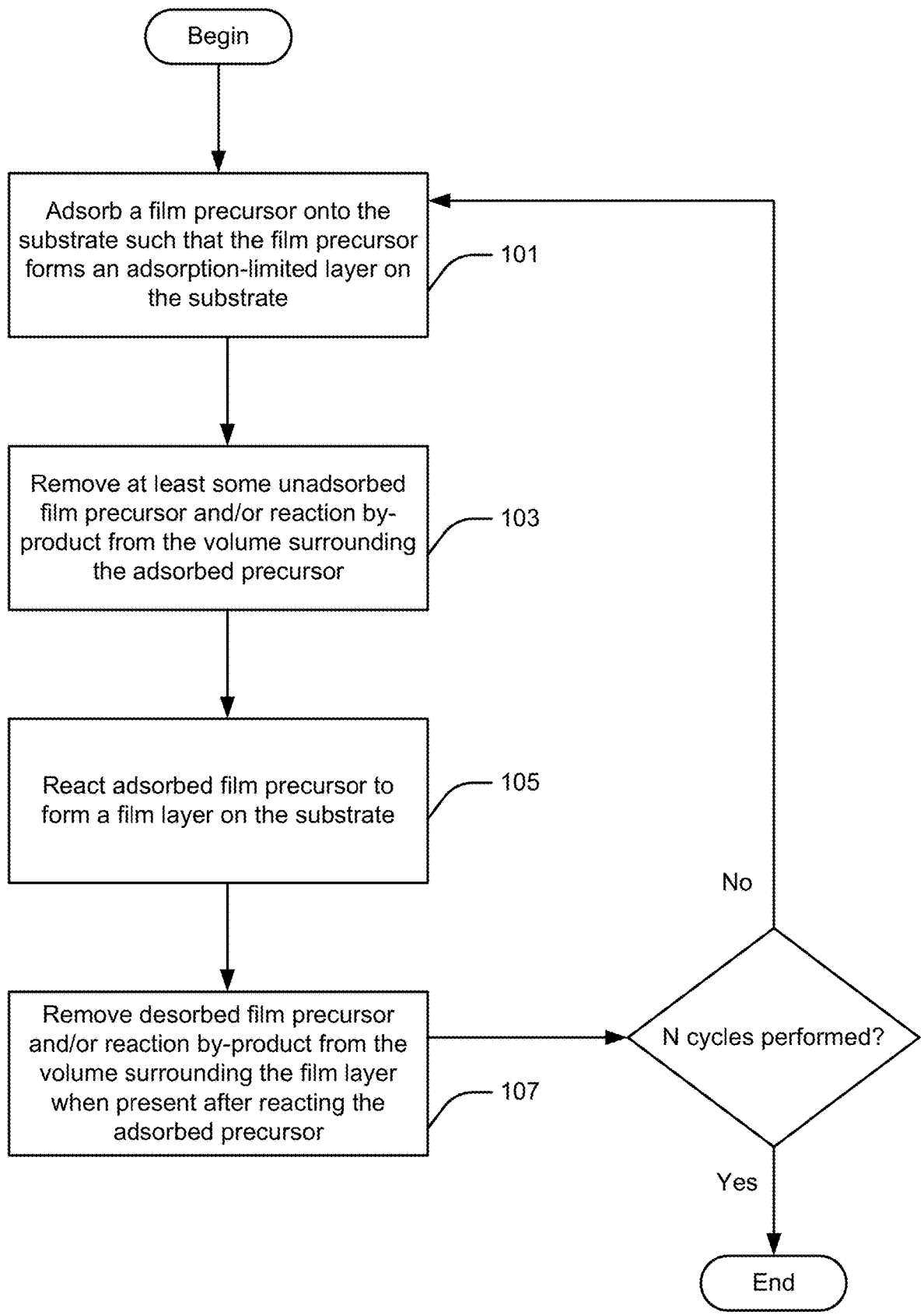
FIG. 1 depicts a flowchart of an example sequence of operations for forming a film of material on a substrate via an ALD process.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Manufacture of semiconductor devices typically involves depositing one or more thin films on a planar or non-planar substrate in an integrated fabrication process. In some aspects of the integrated process it may be useful to deposit thin films that conform to substrate topography. One type of reaction that is useful in some cases involves chemical vapor deposition (CVD). In typical CVD processes, gas phase reactants are introduced into a reaction chamber simultaneously and undergo a gas-phase reaction. The reaction products deposit on the surface of the substrate. The reaction may be driven by plasma, in which case the process may be referred to as a plasma enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may cause "bread-loafing" deposition effects that show thicker deposition at top surfaces (e.g., top surfaces of gate stacks) and thinner deposition at recessed surfaces (e.g., bottom corners of gate stacks). Further, because some die may have regions of differing device density, mass transport effects across the substrate surface may result in within-die and within-wafer thickness variations. These thickness variations can result in over-etching of some regions and under-etching of other regions, which can degrade device performance and die yield. Another problem related to CVD processes is that they are often unable to form conformal films in high aspect ratio features. This issue is increasingly problematic as device dimensions continue to shrink.

As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. Atomic Layer Deposition (ALD) is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. For example, each ALD cycle may deposit a film layer of, in one example, between about 0.5-3 Å thick and the total thickness of the layer after performing all of the deposition cycles for a substrate may be about 910 Å. In certain embodiments, each ALD cycle includes the following steps:

1. Exposure of the substrate surface to a first precursor.

2. Purge of the reaction chamber in which the substrate is located.
3. Activation of a reaction of the substrate surface, typically with a plasma and/or a second precursor.
4. Purge of the reaction chamber in which the substrate is located.

The duration of each ALD cycle may typically be less than 25 seconds or less than 10 seconds or less than 5 seconds. The plasma exposure step (or steps) of the ALD cycle may be of a short duration, such as a duration of 1 second or less. FIG. 1 depicts a flowchart of an example sequence of operations for forming a film of material on a substrate via an ALD process. As can be seen in FIG. 1, item 1 above corresponds with block 101, item 2 above corresponds with block 103, item 3 above corresponds with block 105, and item 4 above corresponds with block 107; the four blocks are performed for N cycles, after which the process is stopped.

Figure 2:
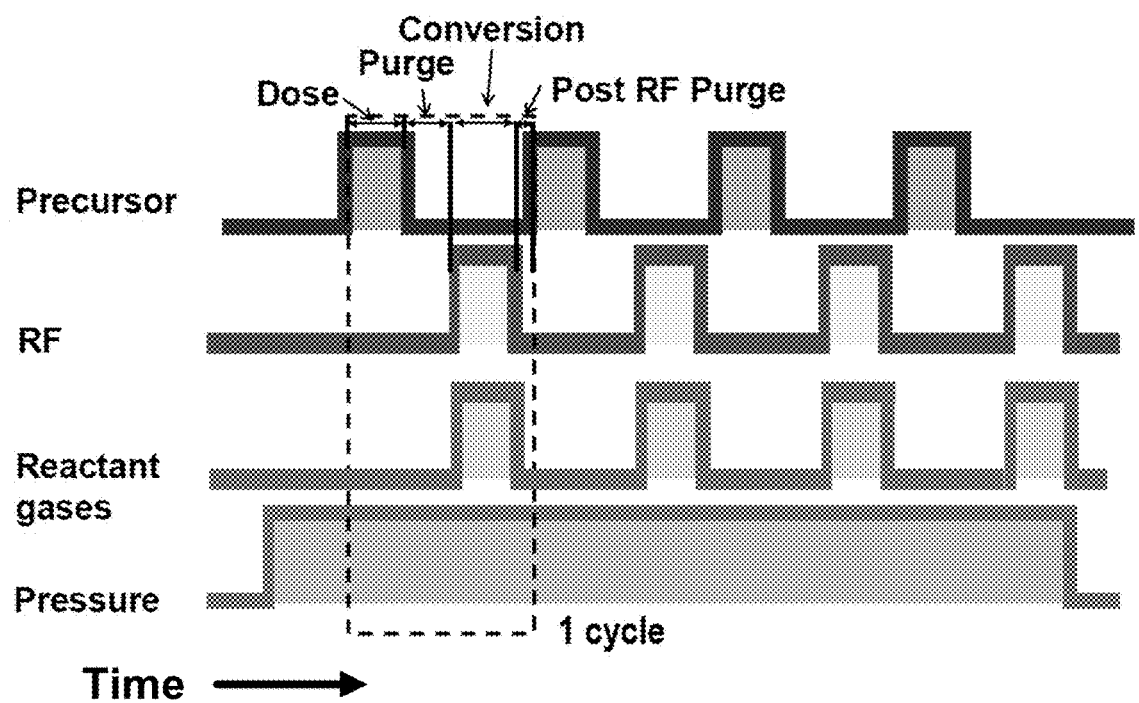
FIG. 2 depicts a timing diagram showing a basic sequence of operations for forming films of material on a substrate via deposition processes.

FIG. 2 depicts a timing diagram showing basic sequence of operations for forming films of material on a substrate via deposition processes. FIG. 2 illustrates the process steps for four deposition cycles, with each cycle including the process steps of precursor delivery, RF power delivery, reactant gas delivery, and pressurization of the processing chamber. The process steps in FIG. 2 are shown through their corresponding lines and are presented as Boolean values, either on or off. A process step is on if its corresponding line is in the "on" position illustrated in FIG. 2 and a process step is off if its corresponding line is in the "off" position illustrated in FIG. 2.

During all four deposition cycles of FIG. 2, the processing chamber may be pressurized. One cycle of deposition is highlighted in FIG. 2 and in that one cycle, the first phase of the deposition cycle may be a dose phase. During the dose phase, the precursor is delivered to the processing chamber, but the RF power is off and reactant gas or gases are not delivered. During the dose phase, the substrate may adsorb the precursor and form an adsorption layer on the substrate. The dose phase of FIG. 2 corresponds to block 101 of FIG. 1. After the dose phase, there may then be a purge phase of the deposition cycle. During the purge phase, precursor delivery stops, but the RF power is still off and reactant gases are still not delivered. The purge phase may remove at least some unadsorbed film precursor and/or reactant byproduct from the volume surrounding the adsorbed precursor. The purge phase of FIG. 2 corresponds to block 103 of FIG. 1.

After the purge phase, the deposition cycle may then enter the conversion phase. During the conversion phase, RF power is turned on while the reactant gas or gases are also delivered. During the conversion phase, the adsorbed film precursor may be reacted to form a film layer on the substrate. The conversion phase of FIG. 2 corresponds to block 105 of FIG. 1. Finally, after the conclusion of the conversion phase, the deposition cycle may enter the post RF purge phase. The post RF purge phase may remove desorbed film precursor and/or reaction byproduct from the volume surrounding the film layer when present after reacting the adsorbed precursor. The post RF purge phase of FIG. 2 corresponds to block 107 of FIG. 1. In the one cycle highlighted in FIG. 2, a thin layer of film, possibly of d thickness, may be deposited on the substrate. In certain embodiments, d may be a thickness of between 0.1 Å and 2.5 Å. Additional cycles may also deposit layers of film, possibly of about d thickness, onto the substrate.

Methods for forming films using ALD/CFD are described in the following U.S. patent applications, each of which is herein incorporated by reference in its entirety: U.S. patent application Ser. No. 13/084,399 (now U.S. Pat. No. 8,728,956), filed on Apr. 11, 2011; U.S. patent application Ser. No. 13/953,616 (now U.S. Pat. No. 9,355,886), filed Jul. 29, 2013; U.S. patent application Ser. No. 14/074,596, filed Nov. 7, 2013; U.S. patent application Ser. No. 14/144,107 (now U.S. Pat. No. 9,076,646), filed Dec. 30, 2013; and U.S. patent application Ser. No. 14/678,736 (now U.S. Pat. No. 9,502,238), filed Apr. 3, 2015.

As material is deposited on the substrates, material from the deposition processes builds up on one or more interior chamber surfaces (e.g., of the chamber walls, pedestal, and showerhead) which is referred to herein as "accumulation." As multiple substrates are processed within the same chamber in between cleanings of that chamber, the accumulation increases as more substrates are processed. For some ALD processes, the accumulation increases substantially linearly (e.g., within 10% of linear). When the accumulation in the chamber reaches a particular thickness, adverse effects may occur in the chamber, such as the material deposited on the chamber may peel or flake off and contaminate a substrate, and the impedance of the plasma may be caused to change which in turn may adversely affect various film properties, including uniformity. Accordingly, when the accumulation reaches such a thickness, which may be referred to as the accumulation limit, the processing of substrates is stopped and the chamber is cleaned.

ALD processes are often carried out in batches; each batch includes a plurality of substrates that may have anywhere from a few substrates to several hundred substrates. A batch of substrates may be defined as the number of substrates that may be processed for a particular ALD process before or when the accumulation limit is reached. For example, an ALD process in a particular chamber may have an accumulation limit of 20,000 Å which is the point at which the accumulation on the chamber causes adverse effects on substrates processed in that chamber. Accordingly, a batch of substrates processed in that chamber is limited to the number of substrates that may be processed in that chamber before the accumulation limit of 20,000 Å is reached. In certain embodiments, the first wafer in a batch is the first wafer processed after a chamber clean. In multi-station reactors, multiple wafers are processed together, so the first wafer may be part of a group of wafers that are collectively the first wafers processed in a batch. The last wafer is the last wafer processed before a chamber clean. In multi-station reactors there will be multiple last wafers.

As noted above, once the accumulation limit is reached for a batch of substrates in a chamber, the chamber is cleaned to remove the accumulated material on the one or more surfaces of the chamber. Chamber cleaning and preparation are further discussed in the following U.S. patents and patent applications, each of which is herein incorporated by reference in its entirety: U.S. patent application Ser. No. 14/089,653, filed Nov. 25, 2013, and titled "CHAMBER UNDERCOAT PREPARATION METHOD FOR LOW TEMPERATURE ALD FILMS"; U.S. patent application Ser. No. 14/158,536, filed Jan. 17, 2014, and titled "METHOD AND APPARATUS FOR THE REDUCTION OF DEFECTIVITY IN VAPOR DEPOSITED FILMS"; U.S. patent application Ser. No. 12/355,601, filed Jan. 16, 2009, and titled "PLASMA CLEAN METHOD FOR DEPOSITION CHAMBER"; U.S. patent application Ser. No. 13/654,303, filed Oct. 17, 2012, and titled "METHODS AND APPARATUS FOR CLEANING DEPOSITION CHAMBERS"; U.S. Pat. Nos. 7,479,191; and 8,262,800. After the reaction chamber is cleaned, a new batch of substrates may be processed.

Certain properties of the deposited film tend to drift over time within a batch. Examples of properties that may drift include film thickness and etching rates, among others. These trending film properties present challenges in certain applications such as double patterning spacers, FinFET spacers, and gate liners and spacers. These applications may require precise critical dimension control, which requires accurate control of film properties such as film thickness, refractive index, etching rates, etc. For example, the processing of about 500 substrates way result in an accumulation of about 10,000 Å and for a 900 Å thick deposition layer on each substrate, the thickness trend may be up to about 10 Å per 1,000 Å of accumulation; a thickness trend of about 1% over the course of processing a batch of substrates may nonetheless adversely affect uniformity of the substrates in the batch.

Large batch sizes are advantageous in terms of maximizing throughput, since less time is lost cleaning and preparing the chamber between batches. In some cases, a batch includes at least about 50 substrates, for example at least about 100 substrates, or at least about 200 substrates, or at least about 300 substrates, or at least about 400 substrates, or at least about 500 substrates. One factor that allows the use of large batch sizes is a large chamber volume. In some cases the chamber volume may be at least about 2 L, for example at least about 0.5 L. Example apparatus that may be adapted for use with the present embodiments include the VECTOR®, SPEED®, ALTUS®, and STRIKER® product family of apparatus, available from Lam Research Corporation of Fremont, Calif. Large chamber volumes may permit multiple substrates to be processed at once, for example at different stations within the chamber volume. Further, large chamber volumes result in a slower buildup of accumulated material on the chamber surfaces, since there is a greater surface area on which such accumulation occurs. However, large batch sizes also contribute to the film property trending problem. For instance, larger batches may result in greater shifts in the film properties within a batch.

As mentioned, the film property trending issue may stem at least in part from the accumulation of material on the interior chamber surfaces. For example, as noted above, the chamber impedance changes as the deposited material accumulates. Accumulation on the chamber walls and on the backside of the showerhead can be especially problematic in terms of a varying chamber impedance. This change in chamber impedance affects the efficiency at which RF power is delivered to the substrate. Thus, while conventional methods generally employ a single RF power setting for an entire batch of substrates, the actual amount of RF power delivered to the substrate changes over the course of a batch. In various cases, the efficiency at which the RF power is delivered to the substrate increases over the course of a batch. With regard to film thickness, for instance, this increased RF delivery efficiency may result in decreasing film thickness as additional substrates in the batch are processed. In some ALD processes, the film thickness may have a decreasing, increasing, or increasing and decreasing trends over the course of processing a batch of substrates.

Figure 3:
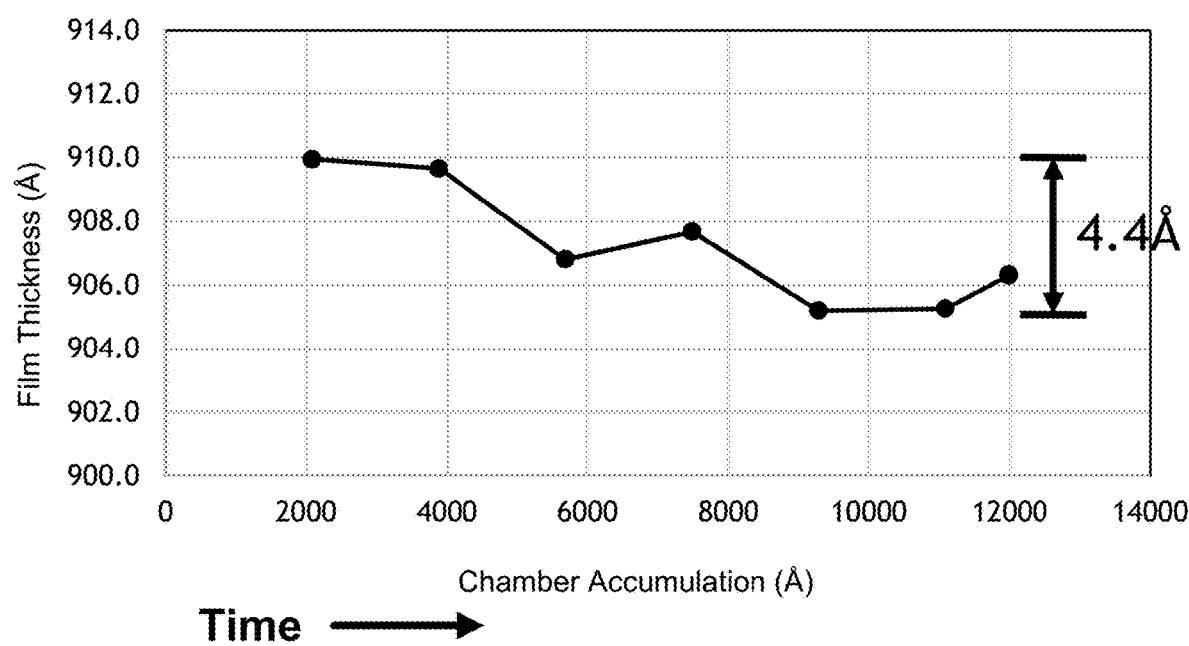
FIG. 3 depicts a graph showing film thickness versus chamber accumulation for an example ALD deposition process for a batch of substrates.

FIG. 3 depicts a graph showing film thickness versus chamber accumulation for an example ALD deposition process for a batch of substrates. For this batch of substrates, the same deposition conditions, including the same number of deposition cycles, was used for all of the substrates in the batch. As noted above, chamber accumulation increases as more and more substrates of the batch are processed, e.g., as time progresses throughout the batch processing. Chamber accumulation typically relates to a metric that is calculated based on the deposition conditions, rather than relating to an actual measured quantity; this may be a linear or substantially linear trend. Nonetheless, chamber accumulation can be reliably calculated and monitored over the batch. In FIG. 3, over the course of processing the batch of substrates, the film thickness of seven substrates was measured and as can be seen, the thickness of the film has a downward trend over the course of processing the batch and varies by an overall amount of about 4.4 Å. This change in deposition thickness also indicates that the deposition rate is changing over the course of processing the batch. As can also be seen, the thickness trend is not linear, but rather is a polynomial representation.

In various embodiments herein, steps are taken to control thickness over an entire batch of substrates. For example, the number of deposition cycles performed on one or more substrates in a batch of substrates may be adjusted over the course of processing that batch of substrates. Some of the techniques described herein adjust the number of deposition cycles to result in a more accurately controlled film thickness for an entire batch of substrates. As discussed below, in some such embodiments these adjustments to the cycle count (i.e., a compensated cycle count) may be based on a relationship between an amount of accumulation and the number of cycles required to achieve a target deposition thickness.

In some embodiments, the deposition conditions remain constant for all of the substrates in the batch except that the number of cycles of deposition may be adjusted. For example, if the thickness of the deposited layer is trending down (e.g., decreasing) over the course of processing the batch of substrates, then this may be caused by a decrease in the deposition rate, and to account for this change, the number of cycles performed on the substrates over the course of processing a substrate in the batch of substrates may be correspondingly adjusted so the number of cycles increases. Similarly, if the thickness of the deposited layer is trending up over the course of processing the batch of substrates, then the number of cycles to deposit a film of a target thickness may be correspondingly decreased throughout the batch.

In some embodiments, the adjustments made to the number of cycles performed on substrates in a batch may be based on data of at least one previously processed batch of wafers, referred herein as an "experimental/calibration batch." It is not necessary to process such an experimental/ calibration batch each and every time a batch is run. In some implementations, the experimental/calibration batch is run once (e.g., once per set of relevant deposition conditions such as particular film types, precursors, flow rates, timing, temperature, pressure, etc.), and the results are used to obtain adjustments to the number of deposition cycles to be performed on one or more substrates in a subsequent batch of substrates (e.g., any batches using the relevant deposition conditions). In some cases the deposition parameters are uniform between the experimental/calibration batch and those used to deposit film on substrates generally, except that the experimental/calibration batch performs the same number of deposition cycles, e.g., N cycles, for all of the substrates in the batch.

The number of cycles used at any point during the experimental/calibration batch may be a number of cycles that are required to achieve a target deposition thickness. For example, this may be the number of cycles performed when there is substantially no accumulation present on the chamber, such as after a cleaning operation has been performed on the chamber interior. This number of cycles may be a measured value (e.g., obtained manually or using metrology equipment) or an estimated or computed value (e.g., obtained using mathematical modeling). In other words, this number of cycles that are required to achieve a target deposition thickness is the number of cycles that should, under normal operating conditions, result in depositing the target thickness on a substrate. As discussed herein, the target thickness is not always deposited onto a substrate for a variety of reasons. For instance, referring to FIG. 3, the target thickness may be 910 Å and if the deposition rate for that process is 0.83 Å per cycle, then the number of cycles that are required to achieve the target deposition thickness is 1,096 cycles.

The data gathered during an experimental/calibration batch may include various parameters, such as the thickness of a deposited layer on a substrate and the accumulation on at least one interior surface of the chamber. For example, during processing of the experimental/calibration batch, the amount of chamber accumulation is monitored/recorded as each substrate is processed; as noted above this may be a metric that is calculated based on the deposition conditions or the number of cycles performed, rather than an actual measured quantity (although in some embodiments it is measured). This monitored accumulation may be considered a predicted or measured amount of accumulation deposition material per deposition cycle that is based on the number of deposition cycles performed. As noted above, the amount of accumulated deposition material may vary substantially linearly over the course of processing a batch of substrates and/or with a number of deposition cycles performed. Also, during the processing of the experimental/calibration batch, measurements of the thickness of the overall deposited layer of a plurality of substrates may be taken. When these thickness measurements are taken, the amount of accumulation is also known for each of these substrates, thereby associating a thickness measurement with a corresponding amount of accumulation. In some embodiments, the deposition thickness per ALD cycle is determined as a function accumulation.

A relationship between film thickness and chamber accumulation can be characterized based on the data, for example by plotting film thickness vs. chamber accumulation over the course of processing a batch, as shown in FIG. 3. The data in FIG. 3 may be considered an experimental/calibration batch of wafers. Here, seven measurements of the thickness of the overall deposited layer on seven different substrates were taken (e.g., a first measurement of 910 Å and a seventh measurement of about 906 Å); such measurements may be made using metrology equipment in situ during processing or using external metrology after the substrate processing is completed. The corresponding accumulation was also obtained during this processing and associated with each of the thickness measurements; for example the first measurement of 910.0 Å was taken when the accumulation was about 2,000 Å (thus these values correspond to each other and are associated with each other) while the seventh measurement of 906.0 Å was taken when the accumulation was about 12,000 Å.

Modeling may then be used to quantify the relationship between the measured deposition thickness data and the accumulation. For example, a polynomial fit or regression may be applied to the measured thickness and accumulation data in order to determine the change in thickness with respect to accumulation over the course of processing a batch of substrates. In some embodiments, like in FIG. 3, the independent variable may be accumulation and the dependent variable may be measured thickness. The polynomial fit may also be a $3^{rd}$ degree polynomial such as $y=x^3*\beta_3+x^2*\beta_2+x*\beta_1+\beta_0$, with x as the accumulation and y as the measured thickness. Applying a fit or regression to this data may return values of the constants of the fit, such as $\beta_3$, $\beta_2$, $\beta_1$, and $\beta_0$ of the example equation herein.

Once the relationship between film thickness and accumulation is obtained, the adjusted number of cycles, referred to herein as "compensated cycle count," for a subsequent batch of substrates can be obtained. By knowing the number of cycles required to reach the target thickness in a chamber having a specified amount of accumulation (e.g., no accumulation) and knowing the current amount of accumulation, the method/system determines a compensated cycle count, which is the number of cycles required to deposit to the target thickness in a chamber having the current amount of accumulation.

Figure 4:
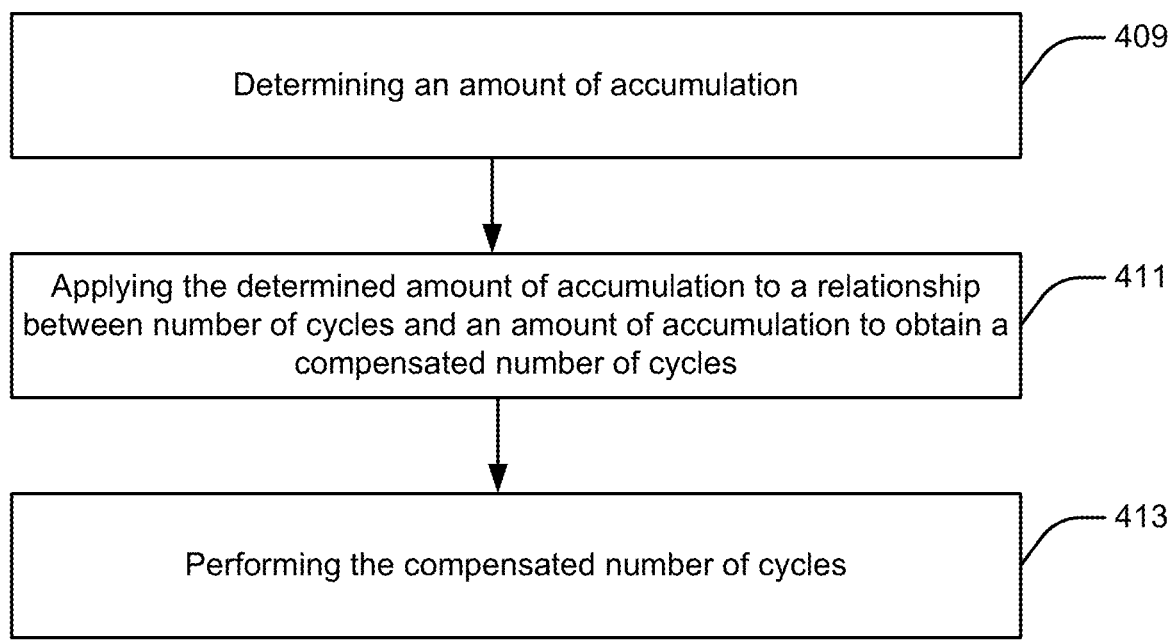
FIG. 4 depicts a flowchart for an example technique for adjusting the number of deposition cycles for substrates in a batch of substrates over the course of processing the batch.

FIG. 4 depicts a flowchart for an example technique for adjusting the number of deposition cycles for substrates in a batch over the course of processing the batch. As noted above, the adjustment is made to account for thickness trending over the course of the batch of substrates and thereby to cause a target thickness to be deposited on each substrate in the batch. Because the known thickness trend is associated with the accumulation over the course of processing the batch, the accumulation value at any point throughout the batch processing is used as the independent variable to determine the compensated cycle count at that point in the batch. Accordingly, in block 409, which may be the first step in the technique, an amount of accumulation is determined. This determination may be a computational or measured determination, as described above, and may be made at any point during the processing of the batch, such as with every substrate in the batch, every other substrate in the batch, every Nth substrate in the batch, or at previously determined times in the batch, such as when the thickness has been determined to change by a particular threshold from the target thickness, such as a change of 1 Å, 0.5 Å, or 0.1 Å.

In block 411, once the known accumulation is determined, that value may be applied to a relationship between (i) the number of deposition cycles required to achieve the target deposition thickness for that batch (as described above, e.g., the number of deposition cycles required to achieve the target deposition thickness when there is no accumulation or substantially no accumulation (e.g., less than 5%) on the chamber interior)), and (ii) a variable representing an amount of accumulated deposition material. These values may be determined before the processing of the batch, such as computationally and/or in the experimental/calibration batch.

The relationship to which the known accumulation, or a parameter derived therefrom (e.g., the rate of change in accumulation or a mathematical function applied to the accumulation), is applied may be a polynomial relationship, such as a polynomial fit derived as described above, in which the compensated cycle count may be a function of the variable representing the amount of accumulation raised to a power, such as three. In some implementations, the relationship may express the compensated cycle count as a function of a sum of terms in which at least two of the terms comprise the variable representing the amount of accumulated deposition currently on the interior region of the deposition chamber raised to a power. For example, the relationship may be expressed as the following function: the compensated number of ALD cycles=the uncompensated number of cycles required to achieve the target deposition thickness times $(x^3*A+x^2*B+x*C+1*D)$. The variable "x" is the determined amount of accumulation currently on the interior chamber and the variable A, B, C, and D are constants that may be obtained using the data from the experimental/calibration batch of substrates described above, such as by a polynomial fit of that data. This equation returns the adjusted or compensated cycle count to be performed given the determined amount of accumulation currently on the chamber interior.

An example application of the operation represented in block 411 may be understood using FIG. 5 which depicts a table depicting various values for an example deposition process of a batch of substrates. In FIG. 5, the first five columns of the table present data from an experimental/calibration batch of substrates in which four substrates were simultaneously processed in a four-station processing chamber. The first column indicates the set of wafers that has been processed, the second column indicates the count of wafers for each set, e.g., the first wafer set has the first four wafers (wafer numbers 1, 2, 3, and 4), while the sixth wafer set includes wafers 21, 22, 23, and 24. The third column indicates the measured thickness of a wafer (after ALD is completed) in each wafer set throughout the whole batch of substrates. As can be seen, the measured thickness begins as 1,024.0 Å, which may be the target thickness, and trends downwards to 1,000.0 Å in the last set of wafers. The fourth column indicates the amount of accumulation on at least an interior surface of the chamber throughout the processing of the batch and after the processing of each wafer set. For example, in the first line of data, 2,210.9 Å of accumulation may be considered present on the interior of the chamber after processing the first set of wafers. The next column titled "Cycle Count" represents the number of cycles performed on each set of wafers in this batch which may be considered the number of cycles required to achieve the target deposition thickness. Here this number of cycles is 1,234 cycles and the target thickness is 1,024 Å; because this batch of substrates is the experimental/calibration batch, 1,234 deposition cycles were performed for all of the wafer sets in the table, but the thickness of the deposited layer nevertheless decreased over the course of processing the batch. In some embodiments, 1,234 cycles may be viewed as the uncompensated cycle count. As accumulation occurs over the course of a batch, a different number of cycles (the compensated cycle count) is required to reach the target thickness.

As stated above, following the processing of this batch, a relationship may be determined between the measured thicknesses and the associated accumulation, such as by applying a polynomial fit to the data, which may then be used to obtain the compensated cycle count and thereby connect accumulation with compensated cycle count. Here, a polynomial fit was applied to the data with x as the accumulation and y as the normalized cycle count, and the constants A, B, C, and D were obtained to be: A=1.03E−18, B=9.89E−13, C=9.91E−7, and D=0.998. The units of these constants may be the inverse of the units of the variable to which it is multiplied. For example, if the variable x is measured in Å, and the variable in the equation is $x^n$, then the constant multiplied by this variable is $1/Å^n$ in order to make the result of this multiplication operation unit-less. Here the A, B, C, and D constants have the following units: A has units of $1/Å^3$, B has units of $1/Å^2$, C has units of $1/Å$, and D is dimensionless. The normalized cycle count is calculated by dividing the target thickness (which is a constant, in this case 1024 Å) by the actual measured thickness (third column in FIG. 5). A normalized cycle count is a unitless value that represents the portion of the above formula $(x^3*A+x^2*B+x*C+1*D)$ and that is used to obtain the compensated cycle count by being multiplied by the number of cycles required to achieve the target deposition thickness. Normalized cycle counts that are greater than 1 indicate that the compensated cycle count will be greater than the number of cycles required to achieve the target deposition thickness and indicate a decreasing thickness trend; normalized cycle counts that are less than 1 indicate that the compensated cycle count will be less than the number of cycles required to achieve the target deposition thickness and indicate an increasing thickness trend. Once the parameters A, B, C, and D are determined from a calibration batch, they are used to determine the compensated cycle count for subsequent non experimental/calibration batches with the same process conditions. These constants may be used to obtain the compensated cycle count for any known accumulation value using the above equation of: the compensated number of ALD cycles=the number of cycles required to achieve the target deposition thickness times $(x^3*A+x^2*B+x*C+1*D)$.

As stated above, to obtain the compensated cycle count for a given amount of accumulation during the processing of a batch of substrates, the normalized cycle count is multiplied by the number of cycles required to achieve the target deposition thickness in a chamber with a baseline amount of accumulation (e.g., substantially no accumulation). In FIG. 5, the Compensated Cycle Count column provides the compensated cycle count for a batch of substrates given the amount of accumulation that is listed in the table even though these accumulation values were determined during the experimental/calibration batch. Here, the number of cycles required to achieve the target deposition thickness is 1,234 which was the number of cycles used in the experimental/calibration batch. If the accumulation value in this later batch is 6,306.9 Å from the fifth wafer set, then 1,234 cycles is multiplied by the normalized cycle count of 1.004 to result in a compensated cycle count of 1,239 cycles. Accordingly, for this known accumulation value, this compensated number of cycles may be performed to result in deposited thickness of 1,024 Å as opposed to 1,019.8 Å that was deposited during the experimental/calibration batch. As can be seen, in a non-experimental/calibration batch of substrates that uses the same process conditions as the experimental/calibration batch, the compensated cycle count increases over the course of processing the batch of substrates to account for the decreasing thickness trend.

Returning to FIG. 4, after the compensated cycle count has been obtained, then the compensated number of cycles may be performed on one or more substrates currently being processed. In some implementations, blocks 409 through 413 may be performed for one or more substrates, or one or more sets of substrates, in a batch. For example, blocks 409-413 may be performed for each substrate or each set of substrates in the batch. In some such implementations, blocks 409 through 413 may be performed during the actual processing of the batch of wafers while in some other such implementations blocks 409 and 411 may be performed before processing the batch of substrates and block 413 is performed for the batch. For instance, the amount of accumulation for a batch of substrates, along with the corresponding relationship between accumulation and thickness, may be values known and determined before processing the batch of substrates that may be used to determine the compensated cycle count before processing the batch; a batch of substrates may then be processed using this information.

After one or more substrates is processed using a compensated cycle count, that substrate may have a deposited layer thickness that substantially matches (e.g., within +/−0.05%) the target thickness. In some embodiments, the deposited layer may be a silicon oxide film or silicon nitride film.

During the processing of a batch of substrates, a determination may be made as to whether the accumulation limit has been reached. As stated above, once the accumulation limit is reached, the processing of the batch may stop and the chamber may be cleaned.

Apparatuses and Systems

The techniques described herein may be performed by any suitable apparatus or system. A suitable apparatus or system includes hardware for accomplishing the process operations and a system controller having instructions for controlling process operations in accordance with the present invention. In some embodiments, the hardware may include one or more process stations included in a process tool.

Figure 6:
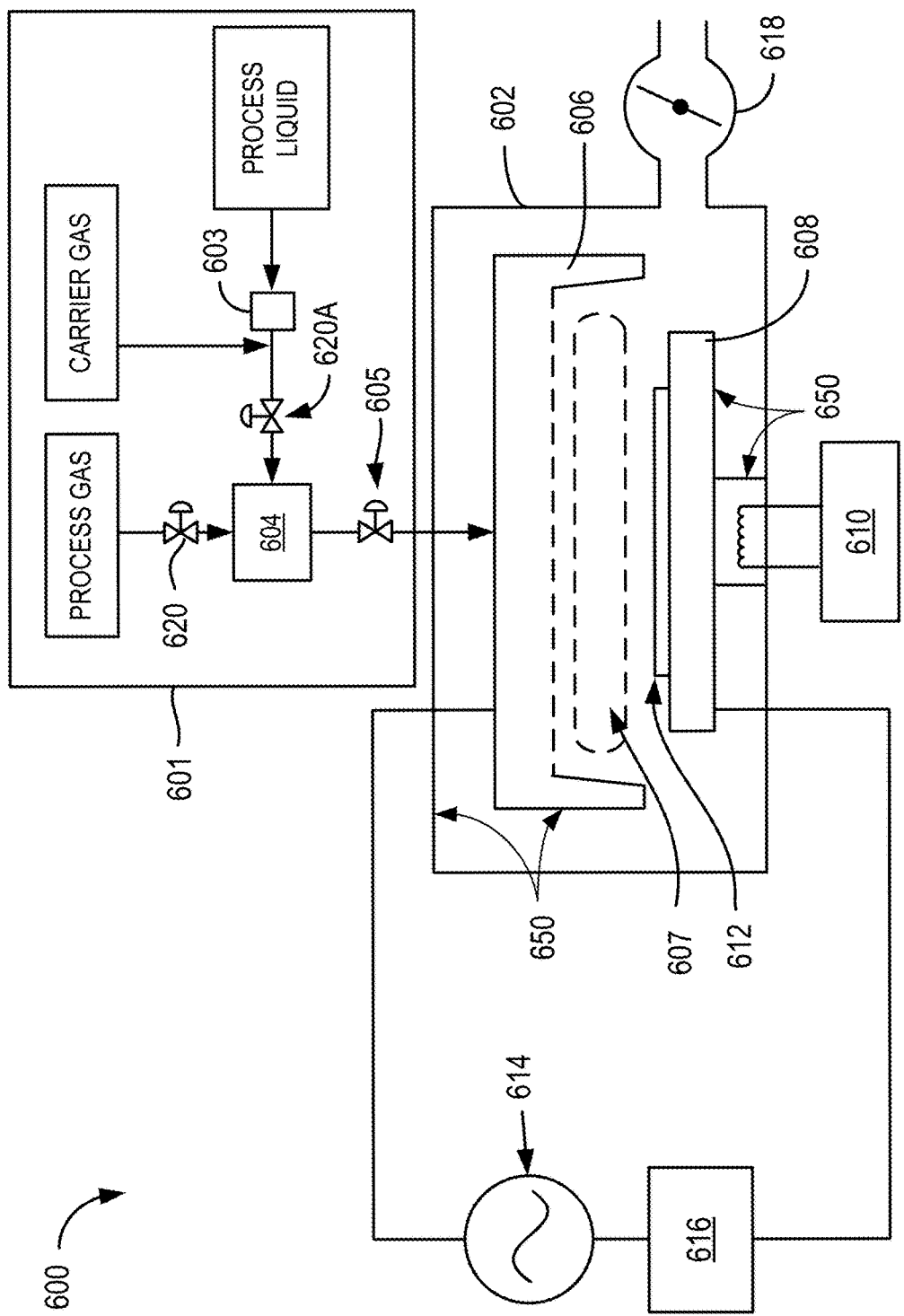
FIG. 6 depicts a schematic embodiment of an example ALD process station.
Figure 7:
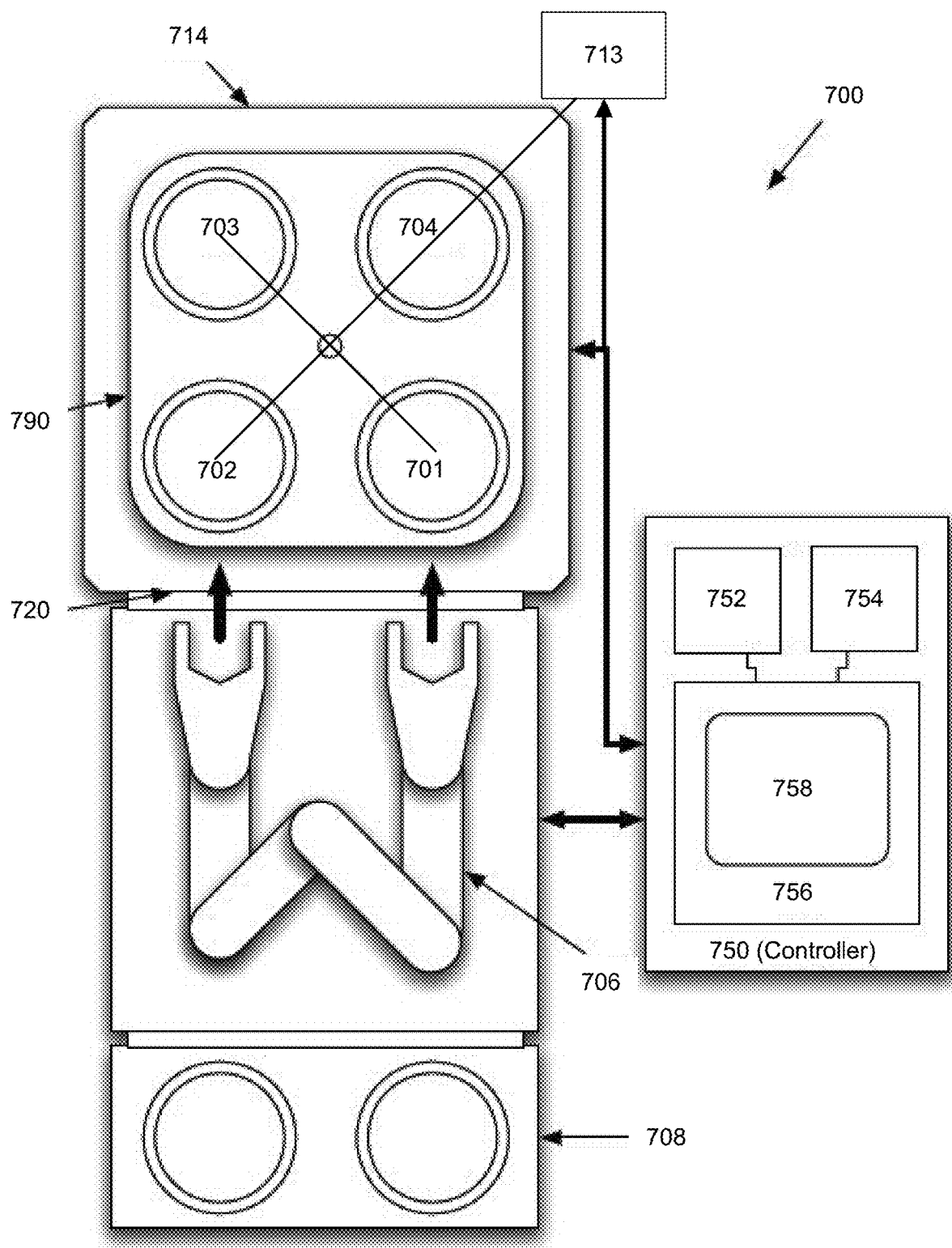
FIG. 7 depicts a schematic view of an embodiment of a multi-station processing tool.

FIG. 6 schematically shows an embodiment of an ALD process station 600. For simplicity, process station 600 is depicted as a standalone process station having a process chamber body 602 for maintaining a low-pressure environment. However, it will be appreciated that a plurality of process stations 600 may be included in a common process tool environment. For example, FIG. 7 depicts an embodiment of a multi-station processing tool 700. Further, it will be appreciated that, in some embodiments, one or more hardware parameters of process station 600, including those discussed in detail above, may be adjusted programmatically by one or more computer controllers.

ALD process station 600 fluidly communicates with reactant delivery system 601 for delivering process gases to a distribution showerhead 606. Reactant delivery system 601 includes a mixing vessel 604 for blending and/or conditioning process gases for delivery to showerhead 606. One or more mixing vessel inlet valves 620 may control introduction of process gases to mixing vessel 604 and another valve 605 to control flow from the mixing vessel to the showerhead 606.

Some reactants, like BTBAS, may be stored in liquid form prior to vaporization at and subsequent delivery to the process station. For example, the embodiment of FIG. 6 includes a vaporization point 603 for vaporizing liquid reactant to be supplied to mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100 degrees Celsius to approximately 150 degrees Celsius at mixing vessel 604.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller upstream of vaporization point 603 may be provided for controlling a mass flow of liquid for vaporization and delivery to process station 600. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 606 distributes process gases toward substrate 612. In the embodiment shown in FIG. 6, substrate 612 is located beneath showerhead 606, and is shown resting on a pedestal 608. It will be appreciated that showerhead 606 may have any suitable shape, and may have any suitable number and arrangement of ports for distributing processes gases to substrate 612. In certain embodiments, the showerhead is configured to deliver two or more gases at different temperatures. Examples of such showerheads are further discussed in U.S. patent application Ser. No. 13/934,597 (now U.S. Pat. No. 9,677,176), filed Jul. 3, 2013, and titled "MULTI-PLENUM, DUAL-TEMPERATURE SHOWERHEAD," U.S. patent application Ser. No. 15/163,594, filed May 24, 2016, and titled "ANTI-TRANSIENT SHOWERHEAD," and U.S. patent application Ser. No. 14/850,816, filed Sep. 10, 2015, and titled "LOW VOLUME SHOWERHEAD WITH FACEPLATE HOLES FOR IMPROVED FLOW UNIFORMITY," all of which are herein incorporated by reference in their entirety.

In some embodiments, a microvolume 607 is located beneath showerhead 606. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 608 may be raised or lowered to expose substrate 612 to microvolume 607 and/or to vary a volume of microvolume 607. For example, in a substrate transfer phase, pedestal 608 may be lowered to allow substrate 612 to be loaded onto pedestal 608. During an ALD process phase, pedestal 608 may be raised to position substrate 612 within microvolume 607. In some embodiments, microvolume 607 may completely enclose substrate 612 as well as a portion of pedestal 608 to create a region of high flow impedance during an ALD process.

Optionally, pedestal 608 may be lowered and/or raised during portions the ALD process to modulate process pressure, reactant concentration, etc., within microvolume 607. In one scenario where process chamber body 602 remains at a base pressure during the process, lowering pedestal 608 may allow microvolume 607 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 608 may allow a plasma density to be varied during plasma activation and/or treatment cycles included in the ALD process. At the conclusion of the ALD process phase, pedestal 608 may be lowered during another substrate transfer phase to allow removal of substrate 612 from pedestal 608.

While the example microvolume variations described herein refer to a height-adjustable pedestal, it will be appreciated that, in some embodiments, a position of showerhead 606 may be adjusted relative to pedestal 608 to vary a volume of microvolume 607. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers.

Returning to the embodiment shown in FIG. 6, showerhead 606 and pedestal 608 electrically communicate with RF power supply 614 and matching network 616 for powering a plasma. Methods and apparatus for applying RF over multiple stations are further discussed in U.S. patent application Ser. No. 14/458,135, filed Aug. 12, 2014, and titled "MULTI-STATION PLASMA REACTOR WITH RF BALANCING," and U.S. patent application Ser. No. 15/143,338, filed Apr. 29, 2016, and titled "VARIABLE CYCLE AND TIME RF ACTIVATION METHOD FOR FILM THICKNESS MATCHING IN A MULTI-STATION DEPOSITION SYSTEM," which are herein incorporated by reference in their entirety. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 608 may be temperature controlled via heater 610. Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to process station 600.

The internal surfaces of the process station 600 are coated with undercoat 650. Examples of surfaces that become coated with undercoat include the chamber walls 602, the chamber ceiling and floor, the pedestal 608 and the showerhead 606. Although FIG. 6 is shown with a substrate 612 in the process station 600, this substrate 612 is not present during deposition of an undercoat. Instead, the substrate 612 is introduced to the process station 600 after the undercoat is deposited, when the process station 600 is ready to be used for depositing film on the substrate 612. These surfaces may also be considered the surfaces of the chamber interior on which accumulation is deposited, including surfaces of the chamber 602 walls, the pedestal 608, and the showerhead 606.

As described above, one or more process stations may be included in a multi-station processing tool. FIG. 7 depicts a schematic view of an embodiment of a multi-station processing tool 700. The tool 700 employs a single substrate processing chamber 714 that contains multiple substrate process stations, each of which may be used to perform processing operations on a substrate held in a wafer holder, e.g., a pedestal, at that process station. In this particular implementation, the multi-station substrate processing apparatus 700 is shown having four process stations 701, 702, 703, and 704. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 706 and a controller 750.

As shown in FIG. 7, the multi-station processing tool 700 has a substrate loading port 720, and a robot 706 configured to move substrates from a cassette loaded through a pod 708 through atmospheric port 720, into the processing chamber 714, and onto one of the four stations 701, 702, 703, and 704.

The depicted processing chamber 714 shown in FIG. 7 provides four process stations, 701, 702, 703, and 704. The RF power is generated at an RF power system 713 and distributed to each of the stations 701, 702, 703, and 704. The RF power system may include one or more RF power sources, e.g., a high frequency (HFRF) and a low frequency (LFRF) source, impedance matching modules, and filters. In certain implementations, the power source may be limited to only the high frequency or low frequency source. The distribution system of the RF power system may be symmetric about the reactor and may have high impedance. This symmetry and impedance result in approximately equal amounts of power being delivered to each station. In some implementations the RF power system may be configured to independently deliver power to each station.

FIG. 7 also depicts an implementation of a substrate transferring device 790 for transferring substrates between process stations 701, 702, 703, and 704 within processing chamber 714. It will be appreciated that any suitable substrate transferring device may be employed. Non-limiting examples include wafer carousels and wafer handling robots.

System Controller

FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. System control software 758 may include instructions for controlling the timing, mixture of gases, chamber and/or station pressure, chamber and/or station temperature, wafer temperature, target power levels, RF power levels, RF exposure time, substrate pedestal, chuck and/or susceptor position, number of cycles performed on one or more substrates, and other parameters of a particular process performed by process tool 700. These programmed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software 758 may be configured in any suitable way. For example, various process tool component subroutines or control objects may be written to control operation of the process tool components necessary to carry out various process tool processes. System control software 758 may be coded in any suitable computer readable programming language.

In some embodiments, system control software 758 may include input/output control (IOC) sequencing instructions for controlling the various parameters described above. For example, each phase of deposition and deposition cycle on a substrate may include one or more instructions for execution by system controller 750. The instructions for setting process conditions for an ALD/CFD deposition process phase may be included in a corresponding ALD/CFD deposition recipe phase. In some embodiments, the recipe phases may be sequentially arranged, so that all instructions for a process phase are executed concurrently with that process phase.

Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700. The positioning program may include instructions for appropriately moving substrates in and out of the reaction chamber as necessary to deposit films on substrates and clean the chamber.

A process gas control program may include code for controlling gas composition and flow rates and optionally for flowing gas into one or more process stations prior to deposition in order to stabilize the pressure in the process station. In some embodiments, the process gas control program includes instructions for introducing gases during formation of a film on a substrate in the reaction chamber. This may include introducing gases for a different number of cycles for one or more substrates within a batch of substrates.

A pressure control program may include code for controlling the pressure in the process station by regulating, for example, a throttle valve in the exhaust system of the process station, a gas flow into the process station, etc. The pressure control program may include instructions for maintaining the same pressure during the deposition of differing number of cycles on one or more substrates during the processing of the batch.

A heater control program may include code for controlling the current to a heating unit that is used to heat the substrate. Alternatively, the heater control program may control delivery of a heat transfer gas (such as helium) to the substrate.

A plasma control program may include code for setting RF power levels, frequencies, and exposure times in one or more process stations in accordance with the embodiments herein. In some embodiments, the plasma control program may include instructions for using the same RF power levels and/or frequencies and/or exposure times during the deposition of differing number of cycles on one or more substrates during the processing of the batch.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, number of cycles for a substrate, amount of accumulation on at least one surface of the chamber interior, etc. The instructions may control the parameters to operate in-situ deposition of film stacks according to various embodiments described herein.

For example, the system controller may include control logic for performing the techniques described herein, such as determining an amount of accumulated deposition material currently on at least an interior region of the deposition chamber interior, applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the number of cycles performed on a substrate, the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. A method of performing atomic layer deposition in a deposition chamber of a semiconductor processing apparatus, the method comprising:
    (a) determining an amount of accumulation currently on an interior region of a deposition chamber interior, wherein the amount of accumulation changes over the course of processing a batch of substrates;
    (b) applying, by a controller of the semiconductor processing apparatus, the amount of accumulation determined in (a), or a parameter derived therefrom, to a relationship between (i) an uncompensated number of ALD cycles required to achieve a target deposition thickness, and (ii) a variable representing an amount of accumulation, wherein the applying returns a compensated number of ALD cycles for producing the target deposition thickness given the amount of accumulation currently on the interior region of the deposition chamber interior, wherein the compensated number of ALD cycles is different than the uncompensated number of ALD cycles; and
    (c) performing the compensated number of ALD cycles on one or more substrates in the batch of substrates.

2. The method of claim 1, wherein determining the amount of accumulation comprises calculating the amount of accumulation by using a number of ALD cycles performed and a predicted amount of accumulation per ALD cycle.

3. The method of claim 1, wherein the amount of accumulation varies substantially linearly over the course of processing a batch of substrates.

4. The method of claim 1, wherein the amount of accumulation varies substantially linearly with a number of ALD cycles.

5. The method of claim 1, wherein determining the amount of accumulation comprises measuring the amount of accumulation in situ.

6. The method of claim 1, wherein the relationship is based, at least in part, on a trend of thicknesses of substrates in a batch of substrates over the course of processing that batch of substrates.

7. The method of claim 1, wherein the relationship is based, at least in part, on data of at least one processed batch of substrates, wherein the same number of deposition cycles were performed on each of the substrates in the processed batch of substrates, and wherein the data includes thicknesses of a plurality of substrates in the processed batch of substrates and the corresponding amount of accumulation for each of the substrates in the plurality of substrates.

8. The method of claim 7, wherein the relationship is a polynomial fit of the data.

9. The method of claim 1, wherein the relationship is a polynomial relationship in which the compensated number of ALD cycles for producing the target deposition thickness is a function of the variable representing the amount of accumulation, wherein the variable representing the amount of accumulation is raised to a power.

10. The method of claim 9, wherein the power is three.

11. The method of claim 9, wherein the polynomial relationship expresses the uncompensated number of ALD cycles required to achieve a target deposition thickness as a function of a sum of terms, wherein at least two of the terms comprise the variable representing the amount of accumulation currently on the interior region of the deposition chamber interior raised to a power.

12. The method of claim 9, wherein the polynomial relationship is expressed as the following: the compensated number of ALD cycles=the uncompensated number of ALD cycles required to achieve a target deposition thickness times $(x^3*A+x^2*B+x*C+1*D)$, wherein x is the amount of accumulation currently on the interior region of the deposition chamber interior, and wherein A, B, C, and D are constants.

13. The method of claim 1, further comprising:
(d) repeating (a) through (c) for all of the substrates in the batch of substrates.

14. The method of claim 1, further comprising:
(e) removing, after (c), the one or more substrates from the deposition chamber, wherein the one or more substrates comprises an ALD deposited layer having the target deposition thickness.

15. The method of claim 1, wherein the atomic layer deposition produces a silicon oxide film or silicon nitride film.

* * * * *